(12) United States Patent
Chu

(10) Patent No.: US 7,944,724 B2
(45) Date of Patent: May 17, 2011

(54) TERNARY CONTENT ADDRESSABLE MEMORY HAVING REDUCED LEAKAGE EFFECTS

(75) Inventor: Scott Chu, San Jose, CA (US)

(73) Assignee: NetLogic Microsystems, Inc., Santa Clara, CA (US)

(*) Notice: Subject to any disclaimer, the term of this patent is extended or adjusted under 35 U.S.C. 154(b) by 71 days.

(21) Appl. No.: 12/431,332

(22) Filed: Apr. 28, 2009

(65) Prior Publication Data
US 2010/0271854 A1 Oct. 28, 2010

(51) Int. Cl.
G11C 15/00 (2006.01)
(52) U.S. Cl. .................. 365/49.17; 365/49.1; 365/49.11; 365/51; 365/63
(58) Field of Classification Search .............. 365/49.17, 365/49.1, 49.11, 51, 63
See application file for complete search history.

(56) References Cited

U.S. PATENT DOCUMENTS

| | | | |
|---|---|---|---|
| 4,045,781 A | 8/1977 | Levy et al. |
| 4,523,301 A | 6/1985 | Kadota et al. |
| 5,045,899 A | 9/1991 | Arimoto |
| 5,062,077 A | 10/1991 | Takashima et al. |
| 5,136,543 A | 8/1992 | Matsuda et al. |
| 5,140,556 A | 8/1992 | Cho et al. |
| 5,276,649 A | 1/1994 | Hoshita et al. |
| 5,280,443 A | 1/1994 | Hidaka et al. |
| 5,327,372 A | 7/1994 | Oka et al. |
| 5,383,159 A | 1/1995 | Kubota |
| 5,396,449 A | 3/1995 | Atallah et al. |
| 5,416,734 A | 5/1995 | Hidaka et al. |
| 5,440,715 A | 8/1995 | Wyland |
| 5,446,685 A | 8/1995 | Holst |
| 5,461,589 A | 10/1995 | Hidaka et al. |
| 5,483,480 A | 1/1996 | Yoneda |
| 5,488,583 A | 1/1996 | Ong et al. |
| 5,499,218 A | 3/1996 | Ahn et al. |
| 5,517,441 A | 5/1996 | Dietz et al. |
| 5,534,732 A | 7/1996 | DeBrosse et al. |
| 5,550,769 A | 8/1996 | Hidaka et al. |
| 5,598,115 A | 1/1997 | Holst |
| 5,649,126 A | 7/1997 | Lynch |
| 5,699,288 A | 12/1997 | Kim et al. |
| 5,706,224 A | 1/1998 | Srinivasan et al. |
| 5,740,097 A | 4/1998 | Satoh |
| 5,818,786 A | 10/1998 | Yoneda |
| 5,852,569 A | 12/1998 | Srinivasan et al. |
| 5,859,791 A | 1/1999 | Schultz et al. |
| 5,936,873 A | 8/1999 | Kongetira |
| 5,964,857 A | 10/1999 | Srinivasan et al. |
| 5,966,319 A | 10/1999 | Sato |
| 5,978,246 A | 11/1999 | Shindo |
| 6,044,005 A | 3/2000 | Gibson et al. |
| 6,075,729 A | 6/2000 | Ohhata et al. |
| 6,101,115 A | 8/2000 | Ross |
| 6,101,116 A | 8/2000 | Lien et al. |
| 6,125,049 A | 9/2000 | Nataraj |

(Continued)

Primary Examiner — Viet Q Nguyen
(74) Attorney, Agent, or Firm — Mahamedi Paradice Kreisman LLP; William L. Paradice, III

(57) ABSTRACT

A column of ternary content addressable memory (TCAM) cells includes a bit line pair that is twisted at a location at or near the center of the column. Data is written to (and read from) TCAM cells located above the twist location with a first bit line polarity. Data is written to (and read from) TCAM cells located below the twist location with a second bit line polarity, opposite the first bit line polarity. As a result, read leakage currents introduced by TCAM cells storing 'Don't Care' values are reduced.

11 Claims, 5 Drawing Sheets

U.S. PATENT DOCUMENTS

| | | | |
|---|---|---|---|
| 6,128,207 A | 10/2000 | Lien et al. | |
| 6,147,891 A | 11/2000 | Nataraj | |
| 6,166,939 A | 12/2000 | Nataraj et al. | |
| 6,175,514 B1 | 1/2001 | Henderson et al. | |
| 6,191,969 B1 | 2/2001 | Pereira | |
| 6,191,970 B1 | 2/2001 | Pereira | |
| 6,195,278 B1 | 2/2001 | Calin et al. | |
| 6,240,001 B1 | 5/2001 | Ross | |
| 6,243,280 B1 | 6/2001 | Wong et al. | |
| 6,243,281 B1 | 6/2001 | Pereira | |
| 6,246,601 B1 | 6/2001 | Pereira | |
| 6,252,789 B1 | 6/2001 | Pereira et al. | |
| 6,256,216 B1 | 7/2001 | Lien et al. | |
| 6,256,241 B1 | 7/2001 | Mehalel | |
| 6,262,907 B1 | 7/2001 | Lien et al. | |
| 6,262,929 B1 | 7/2001 | Miyatake et al. | |
| 6,282,113 B1 | 8/2001 | DeBrosse | |
| 6,292,383 B1 | 9/2001 | Worley | |
| 6,324,087 B1 | 11/2001 | Pereira | |
| 6,331,942 B1 | 12/2001 | Peterson | |
| 6,341,079 B1 | 1/2002 | Chadwick | |
| 6,343,029 B1 | 1/2002 | Kengeri et al. | |
| 6,349,049 B1 | 2/2002 | Schoy | |
| 6,362,993 B1 | 3/2002 | Henderson et al. | |
| 6,370,613 B1 | 4/2002 | Diede et al. | |
| 6,373,738 B1 | 4/2002 | Towler et al. | |
| 6,430,074 B1 | 8/2002 | Srinivasan | |
| 6,442,061 B1 | 8/2002 | Kong et al. | |
| 6,452,822 B1 | 9/2002 | Chai et al. | |
| 6,483,733 B2 | 11/2002 | Lines et al. | |
| 6,499,081 B1 | 12/2002 | Nataraj et al. | |
| 6,500,706 B1 | 12/2002 | Chi | |
| 6,512,682 B2 | 1/2003 | Cohen et al. | |
| 6,560,670 B1 | 5/2003 | Ichiriu | |
| 6,563,727 B1 * | 5/2003 | Roth et al. | 365/49.15 |
| 6,570,794 B1 | 5/2003 | Hokenmaier et al. | |
| 6,597,594 B2 | 7/2003 | Waller | |
| 6,597,596 B2 | 7/2003 | Gordon et al. | |
| 6,646,900 B2 | 11/2003 | Tsuda et al. | |
| 6,657,880 B1 | 12/2003 | Callahan | |
| 6,697,277 B2 | 2/2004 | Towler et al. | |
| 6,708,250 B2 | 3/2004 | Gillingham | |
| 6,785,179 B1 | 8/2004 | Bull et al. | |
| 6,795,325 B1 | 9/2004 | Inoue | |
| 6,803,610 B2 * | 10/2004 | Koolhaas et al. | 257/204 |
| 6,804,134 B2 | 10/2004 | Proebsting et al. | |
| 6,807,077 B2 * | 10/2004 | Noda et al. | 365/49.17 |
| 6,879,504 B1 | 4/2005 | Lien et al. | |
| 6,888,730 B2 | 5/2005 | Foss et al. | |
| 6,900,999 B1 * | 5/2005 | Yen et al. | 365/49.15 |
| 6,901,000 B1 | 5/2005 | Ichiriu et al. | |
| 6,906,937 B1 | 6/2005 | Nataraj | |
| 7,154,764 B2 | 12/2006 | Nataraj | |
| 7,277,309 B1 * | 10/2007 | Banachowicz et al. | 365/49.11 |
| 7,319,602 B1 * | 1/2008 | Srinivasan et al. | 365/49.1 |
| 7,355,890 B1 * | 4/2008 | Wen | 365/185.17 |
| 7,545,661 B2 * | 6/2009 | Srinivasan et al. | 365/49.1 |
| 2003/0002351 A1 * | 1/2003 | Beer et al. | 365/189.07 |
| 2003/0070039 A1 | 4/2003 | Gillingham | |
| 2003/0123269 A1 | 7/2003 | Gillingham et al. | |

* cited by examiner

TERNARY CONTENT ADDRESSABLE MEMORY HAVING REDUCED LEAKAGE EFFECTS

FIELD OF THE INVENTION

The present invention relates to ternary content addressable memory (TCAM) cells. More specifically, the present invention relates an improved read structure for a column of TCAM cells.

RELATED ART

FIG. 1 is a circuit diagram of a conventional ternary content addressable memory (TCAM) cell 100. As defined herein, a TCAM cell is capable of storing three logic values, including a logic '1' value, a logic '0' value and a 'Don't Care' value. TCAM cell 100 includes static random access memory (SRAM) cells 101-102 and match logic 103. SRAM cell 101 includes PMOS transistors 111-112 and NMOS transistors 113-114, which are configured to form a latch circuit 110, and NMOS transistors 115-116, which provide access to latch circuit 110. Similarly, SRAM cell 102 includes PMOS transistors 121-122 and NMOS transistors 123-124, which are configured to form a latch circuit 120, and NMOS transistors 125-126, which provide access to latch circuit 120. Match logic 103 includes NMOS transistors 131-134 and match line ML, which are connected as illustrated.

Data is written to SRAM cell 101 by applying a data value on complementary bit lines B/B# and activating the word line signal WL1. Similarly, data is written to SRAM cell 102 by applying a data value to complementary bit lines B/B# and activating the word line signal WL2. The data value written to SRAM cell 101 is stored on nodes X and X' of latch circuit 110. Similarly, the data value written to SRAM cell 102 is stored on nodes Y and Y' of latch circuit 120. Thus, a logic '1' data value written to SRAM cell 101 will result in node X being pulled up to a positive supply voltage ($V_{DD}$) through PMOS transistor 111, and node X' being pulled down to ground through NMOS transistor 114. Conversely, a logic '0' data value written to SRAM cell 101 will result in node X being pulled down to ground through NMOS transistor 113, and node X' being pulled up to the $V_{DD}$ supply voltage through PMOS transistor 112. SRAM cell 102 stores data in the same manner as SRAM cell 101 (i.e., Y=$V_{DD}$, Y'=0 represents logic '1'; and Y=0, Y'=$V_{DD}$ represents logic '0'.)

The data values stored by SRAM cells 101 and 102 specify the data value stored by TCAM cell 100. For example, when SRAM cell 101 stores a logic '1' data value and SRAM cell 102 stores a logic '0' data value, TCAM cell 100 stores a logic '1' data value. Conversely, when SRAM cell 101 stores a logic '0' data value and SRAM cell 102 stores a logic '1' data value, TCAM cell 100 stores a logic '0' data value. When SRAM cells 101 and 102 both store a logic '0' data value, TCAM cell 100 stores a 'Don't Care' value. An invalid state exists if SRAM cells 101 and 102 both store a logic '1' data value. That is, SRAM cells 101 and 102 do not store logic '1' data values at the same time during the normal operation of TCAM cell 100.

The data values stored by SRAM cells 101 and 102 are provided to match logic 103. More specifically, nodes X and Y of SRAM cells 101 and 102 are connected to the gates of NMOS transistors 131 and 132, respectively. A search operation is performed by TCAM cell 100 as follows. The match line ML is initially precharged to a logic high voltage. A search value is then applied to complementary search lines S/S#. A search value of '0' is applied by pulling down the search line S to a logic low voltage and pulling up the complementary search line S# to a logic high voltage. Conversely, a search value of '1' is applied by pulling up the search line S to a logic high voltage and pulling down the complementary search line S# to a logic low voltage.

If the data stored by TCAM cell 100 matches the applied search value, or the TCAM cell 100 stores a 'Don't Care' value, then the match line ML will remain in the precharged state. That is, at least one of the transistors 131 and 133 will be turned off, and at least one of the transistors 132 and 134 will also be turned off, thereby preventing the match line ML from discharging to ground. However, if the data stored by TCAM cell 100 does not match the applied search value, the match line ML is discharged, thereby indicating a non-match condition. Under these conditions, either transistors 131 and 133 will be turned on, or transistors 132 and 134 will be turned on, thereby providing a discharge path from the match line ML to ground.

The data stored in TCAM cell 100 is read by reading the contents of SRAM cells 101 and 102. A read operation is performed to SRAM cell 101 in the following manner. Bit lines B and B# are pre-charged to the $V_{DD}$ supply voltage, and a logic high read voltage (e.g., $V_{DD}$) is applied to the corresponding word line WL1. Under these conditions, NMOS access transistors 115-116 turn on, thereby coupling nodes X and X' to bit lines B and B#, respectively. One of these nodes X or X' is pulled down toward the ground supply voltage, depending on the data value stored by SRAM cell 101. For example, if a logic '1' data value is stored by SRAM cell 101, then NMOS transistor 114 is turned on, thereby pulling the voltage on node X' down toward the ground supply voltage. Under these conditions, the voltage of the complementary bit line B# will be pulled down toward ground through the conductive path that exists through turned on NMOS transistors 114 and 116. Note that the low voltage on node X' turns on PMOS transistor 111 and turns off NMOS transistor 113, such that the pre-charged bit line B is not pulled down toward the ground supply voltage. The voltage difference between bit lines B and B# is sensed to identify the state of the data value stored by SRAM cell 101.

While SRAM cell 101 is being read, a logic low voltage (e.g., ground) is applied to the word line WL2, such that the NMOS access transistors 125-126 of SRAM cell 102 are turned off. However, one of the nodes Y or Y' of SRAM cell 102 will be pulled down toward the ground supply voltage, depending on the data value stored by SRAM cell 102. For example, if a logic '0' data value is stored by SRAM cell 102, then NMOS transistor 123 is turned on, thereby pulling the voltage on node Y down toward the ground supply voltage. Under these conditions, a small leakage current will exist through NMOS access transistor 125, wherein this small leakage current will tend to pull the voltage on the corresponding bit line B down toward the ground supply voltage. However, this small leakage current, by itself, is not sufficient to disrupt the read operation to SRAM cell 101. As process technologies result in smaller devices, transistor leakage currents increase. If enough leakage current is introduced, (e.g., by other CAM cells coupled to bit lines B and B#), the voltage difference developed between bit lines B and B# may become too small to reliably read the contents of the SRAM cell 101.

FIG. 2 is a block diagram illustrating a conventional column 201 of 500 TCAM cells $200_0, 200_1, 200_2, \ldots 200_{499}$, each of which is identical to TCAM cell 100. Note that only portions of TCAM cells $200_0$-$200_{499}$ are illustrated for purposes of clarity. In the illustrated example, TCAM cell $200_0$ stores a logic '1' data value (i.e., X=$V_{DD}$, X'=0, Y=0, Y'=$V_{DD}$), and each of the other CAM cells $200_1$-$200_{499}$ in the column stores a 'Don't Care' value (i.e., X=0, X'=$V_{DD}$, Y=0, Y'=$V_{DD}$). This pattern represents the worst case conditions for a read operation to the SRAM cell 101 of TCAM cell 200$_0$. As described above, a read operation to SRAM cell 101 will cause node X' to pull down the voltage on the complementary bit line B#. However, the leakage currents associated with the other 999 SRAM cells in column 201 will tend to pull down the voltage on the bit line B. As a result, the voltage difference between bit lines B and B# may be relatively small, thereby rendering the read result unreliable. In addition, the read speed may be slow, as a relatively long time is required for a maximum voltage difference to be developed and sensed on the bit lines B and B#. To obtain an acceptable read speed, the column may need to be made shorter. However, by making the column shorter, a larger number of columns is necessary to maintain the same capacity. This undesirably results in an increase in layout area due to the additional accessing circuits required to access the additional columns.

It would therefore be desirable to have an improved TCAM column structure that mitigates the above-described problems.

SUMMARY

Accordingly, the present invention provides a TCAM column structure that includes a plurality of TCAM cells arranged in a column. A bit line pair is connected to each of the TCAM cells in the column, wherein data is written to and read from the TCAM cells on the bit line pair. The bit line pair is twisted at a location at (or near) the middle of the column, such that an equal (or approximately equal) number of TCAM cells are located above and below the bit line twist location.

Data is written to (and read from) the TCAM cells located above the twist location with a first bit line polarity. Data is written to (and read from) the TCAM cells located below the twist location with a second bit line polarity, opposite the first bit line polarity. As a result, 'Don't Care' values stored in TCAM cells located above the twist location will introduce leakage current on a first bit line of the bit line pair during read operations, and 'Don't Care' values stored in TCAM cells located below the twist location will introduce leakage current on a second bit line of the bit line pair during read operations. Consequently, the read leakage current introduced by a TCAM cell that stores a 'Don't Care' value and is located above the twist location is offset by the read leakage current introduced by a TCAM cell that stores a 'Don't Care' value and is located below the twist location. Thus, the worst case condition for read operations exists when one half of the TCAM cells in the column store 'Don't Care' values.

The present invention will be more fully understood in view of the following description and drawings.

DETAILED DESCRIPTION

Figure 1:
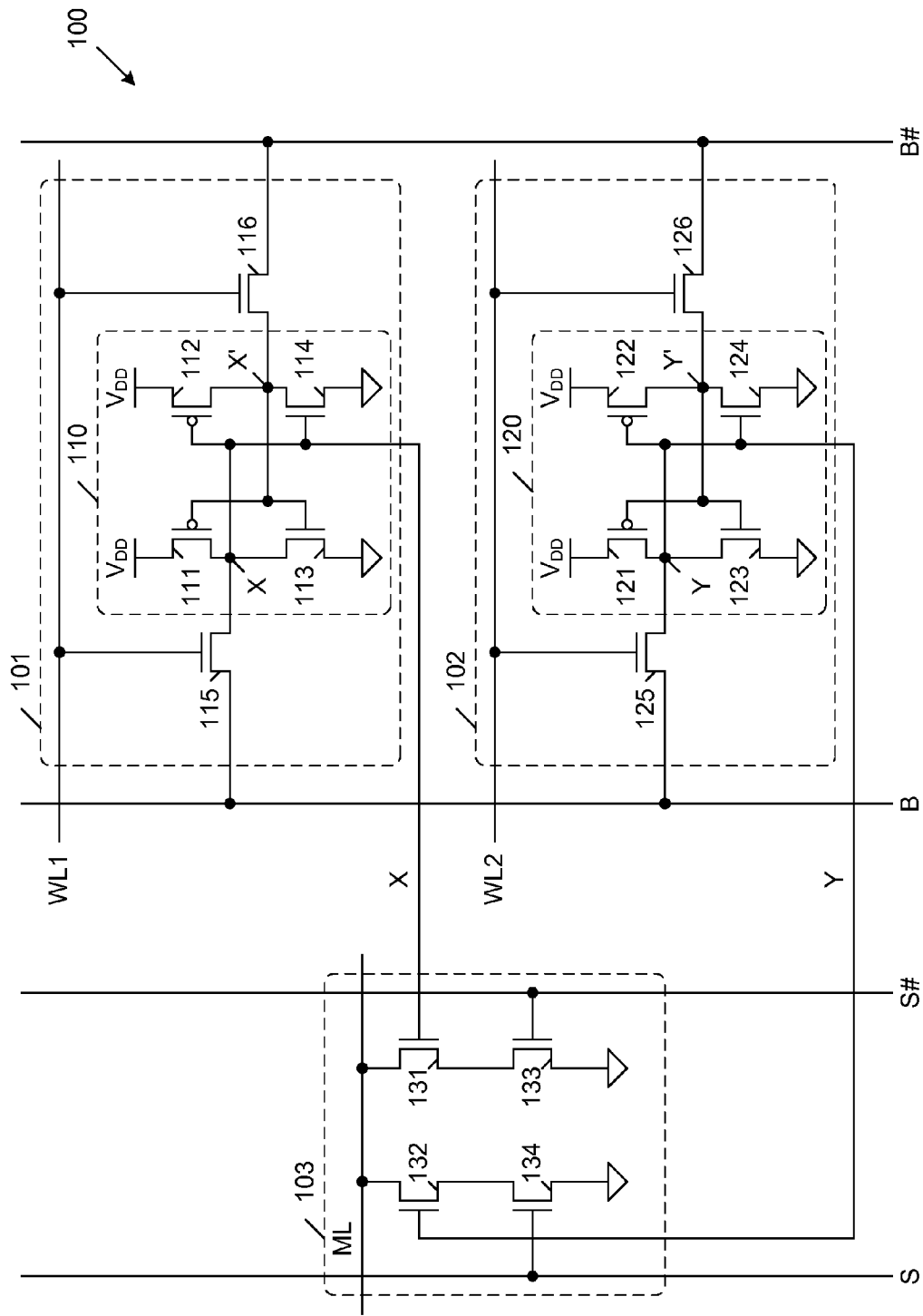
FIG. 1 is a circuit diagram of a conventional ternary content addressable memory cell.
Figure 3:
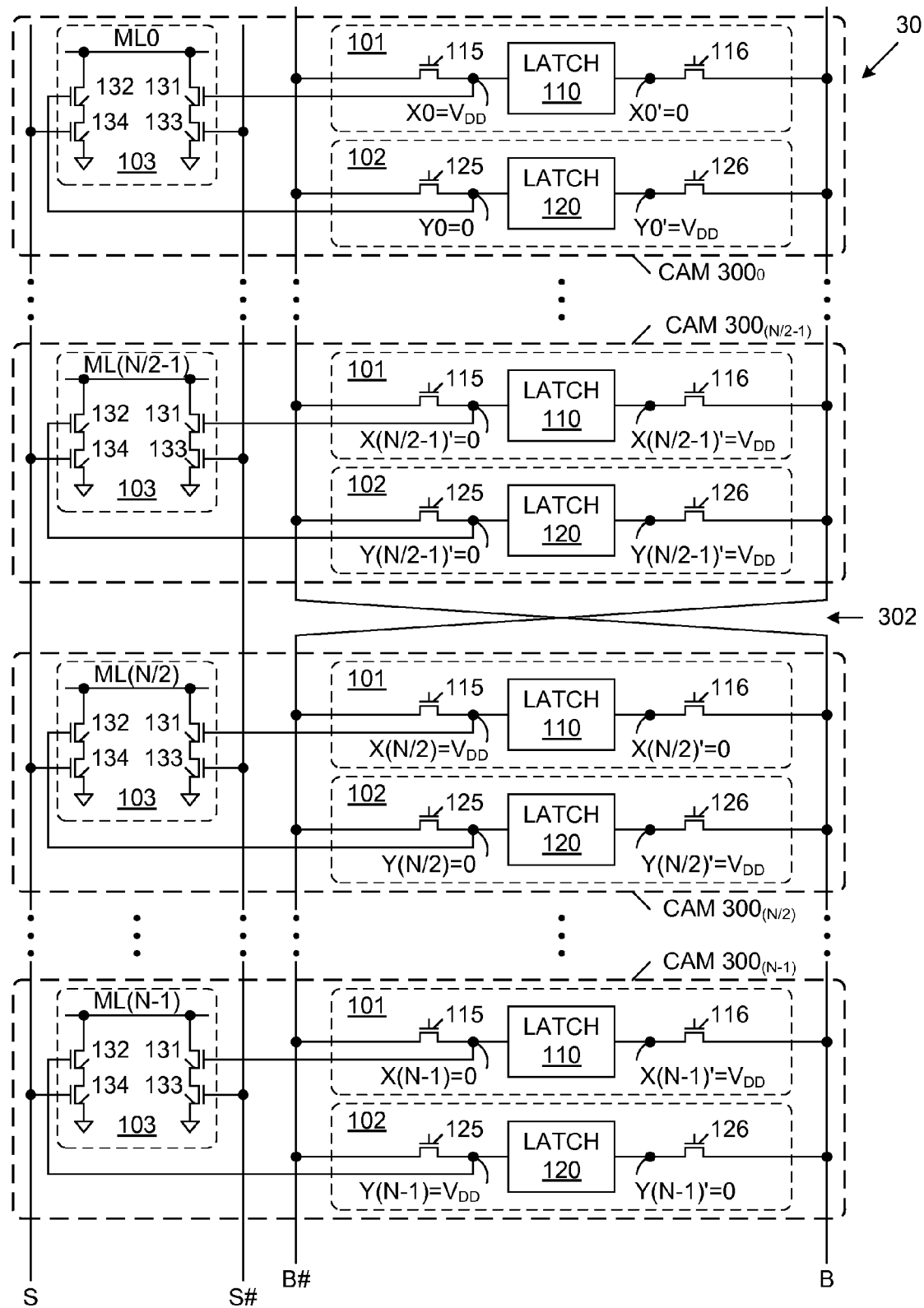
FIG. 3 is a block diagram of a column of ternary content addressable memory cells in accordance with one embodiment of the present invention.

FIG. 3 is a block diagram illustrating a column 301 of N TCAM cells 300$_0$-300$_{(N-1)}$, each of which is identical to TCAM cell 100 (FIG. 1). Similar elements in FIGS. 1 and 3 are labeled with similar reference numbers. Thus, each TCAM cell 300$_z$ includes corresponding SRAM cells 101-102 and match logic 103. Note that word lines are not shown in FIG. 3 for purposes of clarity. Within FIG. 3, the storage nodes of each TCAM cell 300$_z$ are labeled XZ, XZ', YZ and YZ', wherein Z includes the integers from 0 to N−1, inclusive. For example, TCAM cell 300$_0$ includes storage nodes X0, X0', Y0 and Y0'.

The SRAM cells within TCAM cells 300$_0$-300$_{(N-1)}$ are connected to a complementary bit line pair, which includes bit lines B and B#. In accordance with one embodiment of the present invention, bit lines B and B# are twisted at a location 302 between the top and bottom of the column 301. That is, for TCAM cells above twist location 302, the storage nodes XZ and YZ are coupled to bit line B through the corresponding access transistors 115 and 125, and the storage nodes XZ' and YZ' are coupled to the complementary bit line B# through the corresponding access transistors 116 and 126. However, for TCAM cells below twist location 302, the storage nodes XZ' and YZ' are coupled to bit line B through the corresponding access transistors 116 and 126, and the storage nodes XZ and YZ are coupled to the complementary bit line B# through the corresponding access transistors 115 and 125.

In the illustrated example, bit lines B and B# are twisted at the half-way point of the column 301, such that TCAM cells 300$_0$-300$_{(N/2-1)}$ are located above the twist location 302, and TCAM cells 300$_{(N/2)}$-300$_{(N-1)}$ are located below the twist location 302. In other embodiments, twist location 302 may be located at other positions along column 301. As described in more detail below, twisting the bit lines B/B# advantageously minimizes the adverse affect of leakage current on read operations within column 301.

The match logic 103 within each of TCAM cells 300$_0$-300$_{(N-1)}$ is coupled to a complementary search line pair, which includes search line S and complementary search line S#. It is important to note that the search lines S and S# are not twisted in the present embodiment. Search operations are performed in the same manner described above in connection with FIG. 1.

Column 301 is operated as follows in accordance with one embodiment of the present invention. TCAM cells 300$_0$-300$_{(N/2-1)}$, which are located above the bit line twist location 302 (e.g., in the top half of column 301), are written with a first bit line polarity. Conversely, TCAM cells 300$_{(N/2)}$-300$_{(N-1)}$, which are located below the bit line twist location 302 (i.e., in the bottom half of column 301) are written with a second bit line polarity, opposite the first bit line polarity.

In accordance with one embodiment, the first bit line polarity is defined by the following example. To write a logic '1' value to the SRAM cells 101-102 within upper TCAM cells 300$_0$-300$_{(N/2-1)}$, a logic high voltage ($V_{DD}$) is applied to bit line B and a logic low voltage (0 Volts) is applied to complementary bit line B# (and the corresponding word line is activated). Conversely, to write a logic '0' value to the SRAM cells 101-102 within upper TCAM cells $300_0$-$300_{(N/2-1)}$, a logic low voltage (0 Volts) is applied to bit line B and a logic high voltage ($V_{DD}$) is applied to complementary bit line B# (and the corresponding word line is activated). Thus, in the example illustrated by FIG. 3, SRAM cell 101 of TCAM cell $300_0$ stores a logic '1' data value (i.e., X0=$V_{DD}$ and X0'=0), and SRAM cell 102 of TCAM cell $300_0$ stores a logic '0' data value (i.e., Y0=0 and Y0'=$V_{DD}$).

In accordance with the present embodiment, the second bit line polarity is defined by the following example. To write a logic '1' value to the SRAM cells 101-102 within lower TCAM cells $300_{(N/2)}$-$300_{(N-1)}$, a logic low voltage (0 Volts) is applied to bit line B, and a logic high voltage ($V_{DD}$) is applied to complementary bit line B# (and the corresponding word line is activated). Conversely, to write a logic '0' value to the SRAM cells 101-102 within lower TCAM cells $300_{(N/2)}$-$300_{(N-1)}$, a logic high voltage ($V_{DD}$) is applied to bit line B and a logic low voltage (0 Volts) is applied to complementary bit line B# (and the corresponding word line is activated). Thus, in the example illustrated by FIG. 3, SRAM cell 101 of TCAM cell $300_{(N/2)}$ stores a logic '1' data value (i.e., X(N/2)=$V_{DD}$ and X(N/2)'=0), and SRAM cell 102 of TCAM cell $300_{(N/2)}$ stores a logic '0' data value (i.e., Y(N/2)=0 and Y(N/2)'=$V_{DD}$).

A logic '1' data value is written within each of the TCAM cells $300_0$-$300_{(N-1)}$ by writing a logic '1' value to the corresponding SRAM cell 101 and writing a logic '0' value to the corresponding SRAM cell 102. Thus, in the example illustrated by FIG. 3, TCAM cells $300_0$ and $300_{(N/2)}$ each store a logic '1' data value.

Conversely, a logic '0' data value is written within each of the TCAM cells $300_0$-$300_{(N-1)}$ by writing a logic '0' value to the corresponding SRAM cell 101 and writing a logic '1' value to the corresponding SRAM cell 102. Thus, in the example illustrated by FIG. 3, TCAM cell $300_{(N-1)}$ stores a logic '0' data value.

A 'don't care' value is written within each of the TCAM cells $300_0$-$300_{(N-1)}$ by writing a logic '0' value to the corresponding SRAM cells 101 and 102. Thus, in the example illustrated by FIG. 3, TCAM cell $300_{(N/2-1)}$ stores a 'Don't Care' value.

Figure 4:
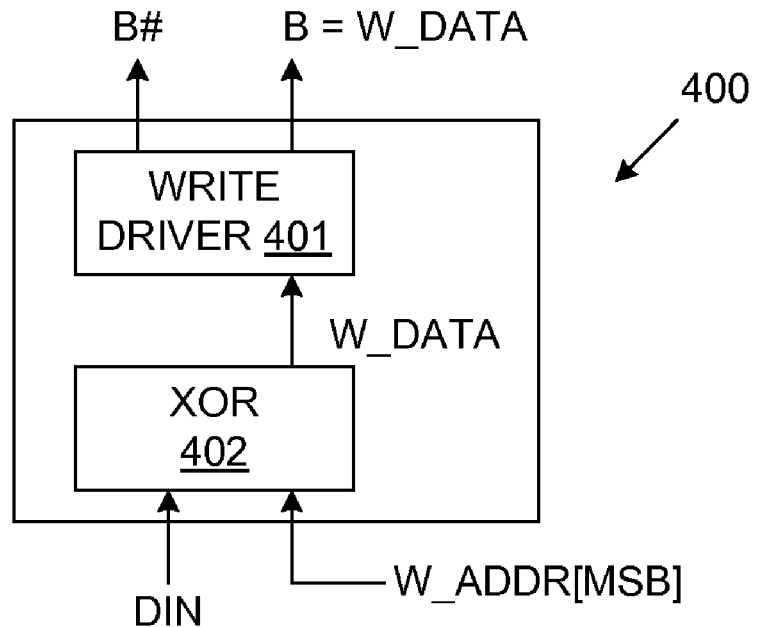
FIG. 4 is a block diagram of write control logic that recognizes and applies first and second bit line polarities during write operations, in accordance with one embodiment of the present invention.

FIG. 4 is a block diagram of write control logic 400 that recognizes and applies the above-described first and second bit line polarities during write operations, in accordance with one embodiment of the present invention. Write control logic 400 includes exclusive OR circuit 401 and write driver 402. Exclusive OR circuit 401 receives the write data value DIN to be written to the TCAM cell in column 301. Exclusive OR circuit 401 also receives the most significant bit (MSB) of the corresponding write address (W_ADDR). The MSB of the write address indicates whether the write operation will be performed to a TCAM cell in the upper half of the column 301, above the twist location 302 (i.e., W_ADDR[MSB]=0), or a TCAM cell in the lower half of the column 301, below the twist location 302 (i.e., W_ADDR[MSB]=1). If the write operation is to be performed to a TCAM cell in the upper half of the column 301, exclusive OR circuit 402 provides the write data value DIN to write driver 401 as the write data signal W_DATA. However, if the write operation is to be performed to a TCAM cell in the lower half of the column 301, exclusive OR circuit 402 provides the inverse of the write data value DIN to write driver 401 as the write data signal W_DATA. Write driver 401 drives the bit lines B and B#, such that the bit line B is driven to a voltage that represents the same logic state as the write data signal W_DATA, and the complementary bit line B# is driven to a voltage that represents the opposite logic state. In this manner, write control logic 400 maintains the first and second bit line polarities described above.

The TCAM cells in column 301 are read as follows in accordance with one embodiment of the present invention. TCAM cells $300_0$-$300_{(N/2-1)}$, which are located above the bit line twist location 302 (e.g., in the top half of column 301), are read with the first bit line polarity. Conversely, TCAM cells $300_{(N/2)}$-$300_{(N-1)}$, which are located below the bit line twist location 302 (i.e., in the bottom half of column 301) are read with the second bit line polarity.

To identify the state of a TCAM cell, each of the associated SRAM cells 101 and 102 is read. Each SRAM cell is read in the following manner. Bit lines B/B# are initially precharged to a logic high voltage ($V_{DD}$), and the access transistors of the corresponding SRAM cell are turned on by activating the corresponding word line. Under these conditions, the one of the storage nodes of the SRAM cell will pull the corresponding bit line down toward ground, and the other one of the storage nodes of the SRAM cell will pull the corresponding bit line up toward $V_{DD}$. As a result, a voltage difference is created across the bit line pair B/B#. This voltage difference is detected by a sense amplifier (not shown).

In accordance with the present embodiment, if the TCAM cell being read is above the bit line twist location 302 (i.e., in the upper half of column 301), then the first bit line polarity is used to identify the read data value. That is, a logic high voltage on bit line B and a logic low voltage on complementary bit line B# is recognized and reported as a logic '1' data value; and a logic low voltage on bit line B and a logic high voltage on complementary bit line B# is recognized and reported as a logic '0' data value.

Conversely, if the TCAM cell being read is below the bit line twist location 302 (i.e., in the lower half of column 301), then the second bit line polarity is used to identify the read data value. That is, a logic high voltage on bit line B and a logic low voltage on complementary bit line B# is recognized and reported as a logic '0' data value; and a logic low voltage on bit line B and a logic high voltage on complementary bit line B# is recognized and reported as a logic '1' data value.

Figure 5:
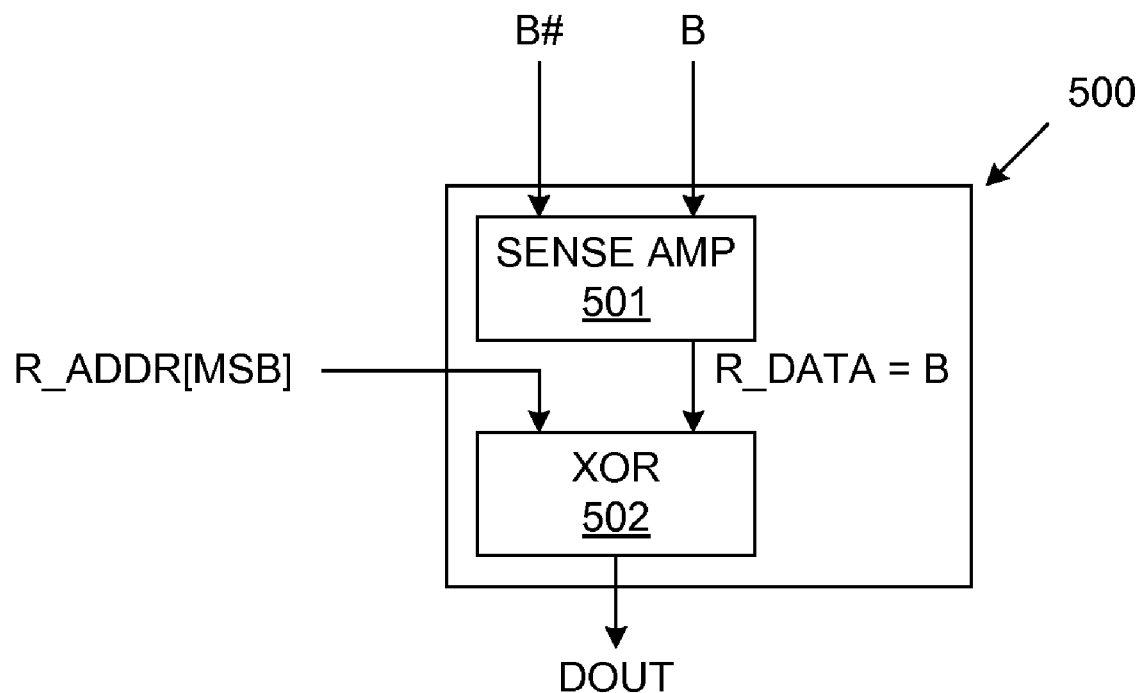
FIG. 5 is a block diagram of read control logic that recognizes and applies first and second bit line polarities during read operations, in accordance with one embodiment of the present invention.

FIG. 5 is a block diagram of read control logic 500 that recognizes and applies the above-described first and second bit line polarities during read operations, in accordance with one embodiment of the present invention. Read control logic 500 includes sense amplifier 501, which amplifies the voltage difference between the bit lines B/B# during a read operation. Sense amplifier 501 provides a read data signal (R_DATA) having the logic state represented by the voltage developed on bit line B. The read data signal R_DATA is provided to exclusive OR circuit 502, along with the most significant bit (MSB) of the corresponding read address (R_ADDR). The MSB of the read address indicates whether the read operation is performed from a TCAM cell in the upper half of the column 301, above the twist location 302 (i.e., R_ADDR[MSB]=0), or a TCAM cell in the lower half of the column 301, below the twist location 302 (i.e., R_ADDR[MSB]=1). If the read operation was performed from a TCAM cell in the upper half of the column 301, exclusive OR circuit 502 provides the read data signal R_DATA as the read data value DOUT. However, if the read operation was performed from a TCAM cell in the lower half of the column 301, exclusive OR circuit 502 provides the inverse of the read data signal R_DATA as the read data value DOUT. In this manner, read control logic 500 maintains the first and second bit line polarities described above.

Figure 2:
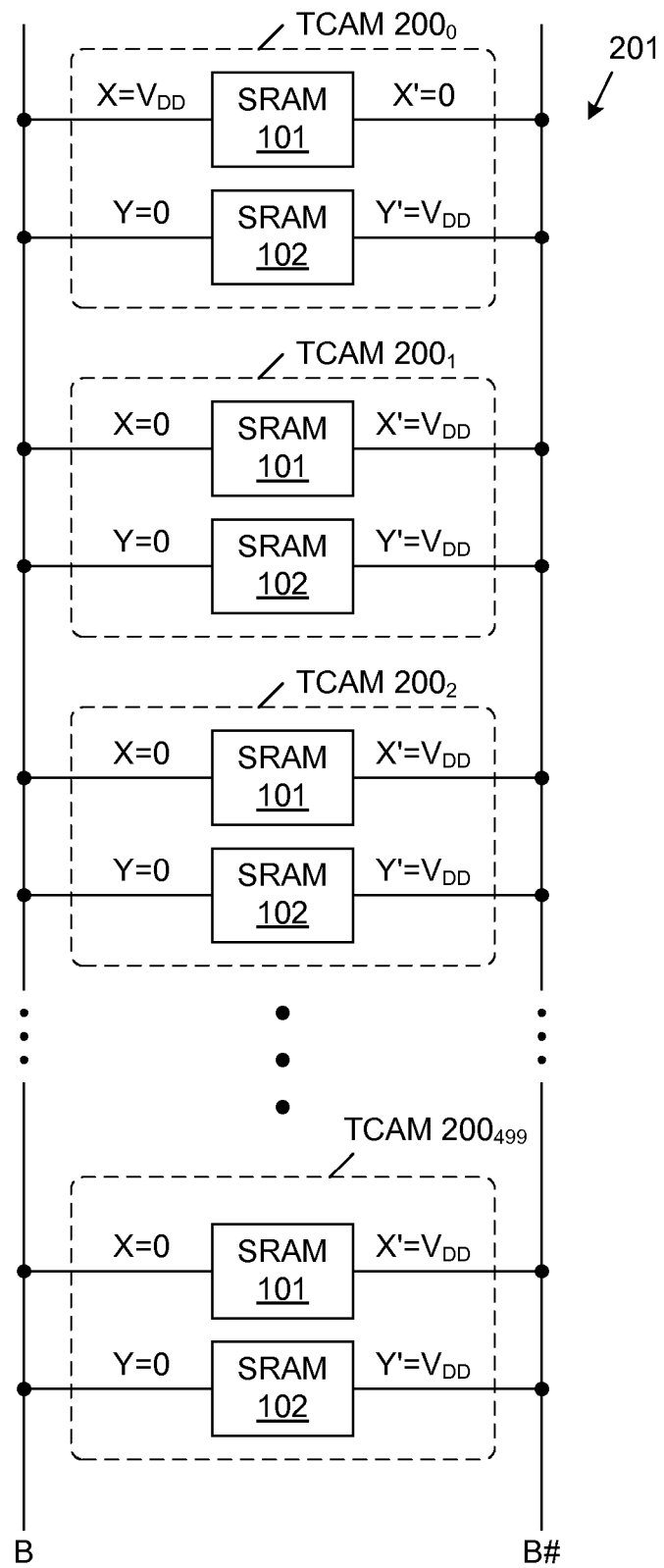
FIG. 2 is a block diagram of a conventional column of ternary content addressable memory cells.

In the present embodiment, worst case read conditions will exist when one of the TCAM cells in a first half of the column 301 stores a logic '1' data value, the remaining TCAM cells in the same half of the column 301 store 'Don't Care' values, and the TCAM cells in the other half of the column 301 do not store 'Don't Care' values. Under these conditions, the leakage current during the read operation is equal to the leakage current through N−1 SRAM cells (compared to 2N−1 SRAM cells in the prior art TCAM column structure of FIG. 2).

For example, assume that there are 500 TCAM cells in column 301. Worst case read conditions would exist, for example, if TCAM cell $300_0$ stores a logic '1' data value (as illustrated in FIG. 3), TCAM cells $300_1$-$300_{249}$ store 'Don't Care' values (as illustrated by TCAM cell $300_{(N/2-1)}$ in FIG. 3), and TCAM cells $300_{250}$-$300_{499}$ store logic '1' data values (as illustrated by TCAM cell $300_{(N/2)}$ in FIG. 3) and/or logic '0' data values (as illustrated by TCAM cell $300_{(N-1)}$ in FIG. 3). Under these conditions, a read operation to SRAM cell 101 of TCAM cell $300_0$ will result in node X0' pulling bit line B# down toward ground. However, the leakage current through the SRAM cell 102 within TCAM cell $300_0$, and the leakage currents through all of the SRAM cells 101-102 within TCAM cells $300_1$-$300_{249}$ will tend to pull down the voltage on bit line B. That is, each of the SRAM cells 101-102 in the upper half of the column 301 (except for the SRAM cell being read) will contribute to the total leakage current.

However, the leakage currents through the SRAM cells 101-102 within TCAM cells $300_{250}$-$300_{499}$ in the lower half of the column 301 will be equally split between bit lines B and B#, such that the net effect of these leakage currents does not affect the voltage difference developed across bit lines B and B#. For example, within TCAM cell $300_{250}$, SRAM cell 101 will have a leakage current through transistor 116 that tends to pull down the voltage on bit line B, while SRAM cell 102 will have an opposing leakage current through transistor 125 that tends to pull down the voltage on complementary bit line B#.

Note that if the TCAM cells $300_{250}$-$300_{499}$ in the lower half of column 301 were written with 'Don't Care' values, the associated leakage currents would tend to pull down the voltage on complementary bit line B#, thereby substantially offsetting the leakage currents associated with TCAM cells $300_0$-$300_{249}$, which tend to pull down the voltage on bit line B.

Also note that it is invalid to write logic '1' values to both of the SRAM cells 101-102 in TCAM cells $300_{250}$-$300_{499}$, thereby eliminating the worst case read conditions of the prior art.

Figure 6:
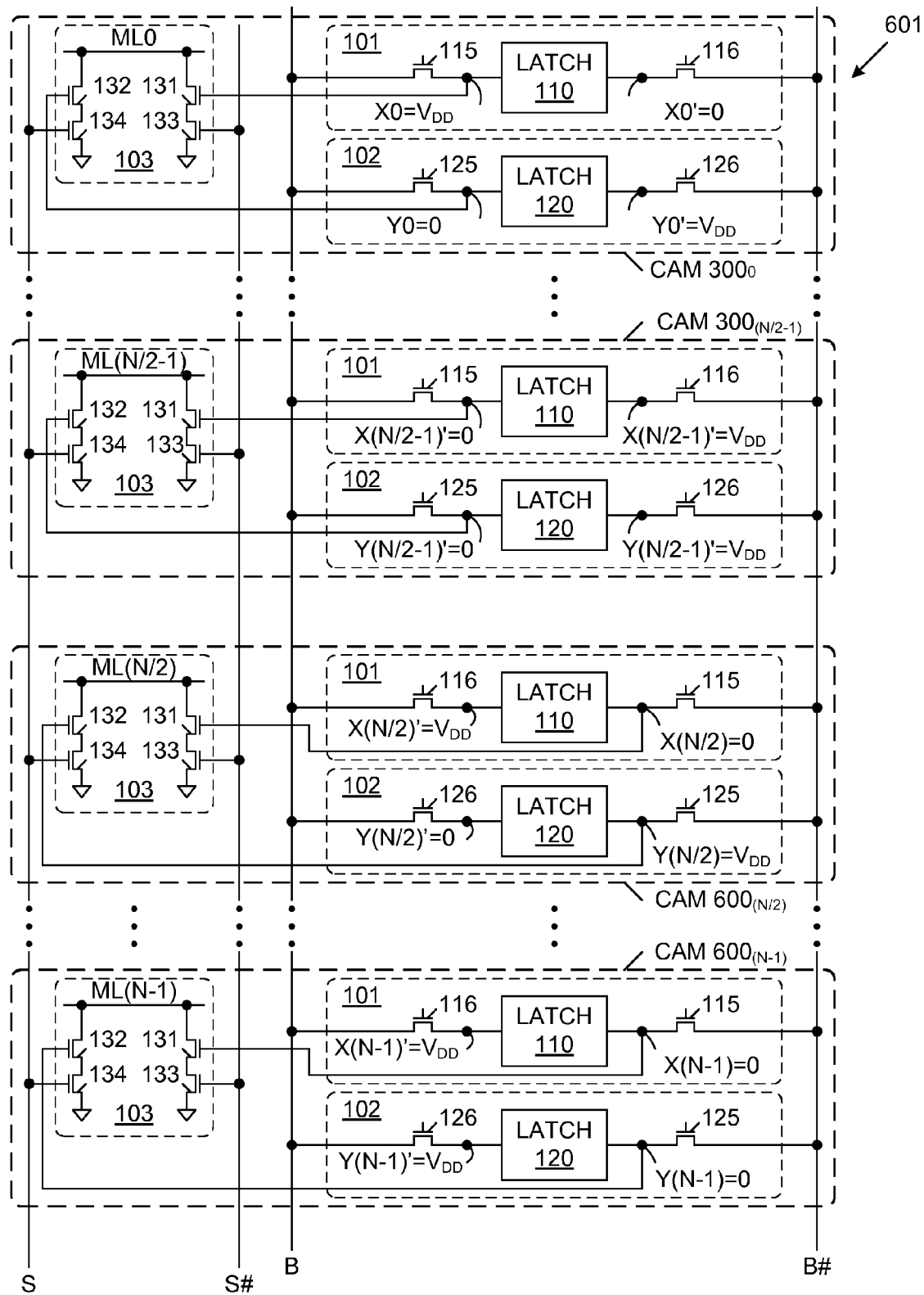
FIG. 6 is a circuit diagram of a column of TCAM cells in accordance with an alternate embodiment of the present invention.

FIG. 6 is a circuit diagram of a column 601 of TCAM cells $300_0$-$300_{(N/2-1)}$, $600_{(N/2)}$-$600_{(N-1)}$ in accordance with an alternate embodiment of the present invention. TCAM cells $300_0$-$300_{(N/2-1)}$ have been described above in connection with FIG. 3. TCAM cells $600_{(N/2)}$-$600_{(N-1)}$ are similar to TCAM cells $300_{(N/2)}$-$300_{(N-1)}$, and are therefore labeled with similar reference numbers. However, TCAM cells $600_{(N/2)}$-$600_{(N-1)}$ are mirror images of TCAM cells $300_{(N/2)}$-$300_{(N-1)}$. In this embodiment, neither search lines S and S# nor bit lines B and B# are twisted. Read and write operations to TCAM cells $300_0$-$300_{(N/2-1)}$ (which are located above location 302) are performed with the first bit line polarity, and read and write operations to TCAM cells $600_{(N/2)}$-$600_{(N-1)}$ (which are located below location 302) are performed with the second bit line polarity. In the illustrated example, TCAM cell $600_{(N/2)}$ stores a logic '0' data value (i.e., X(N/2)=0, X(N/2)'=$V_{DD}$, Y(N/2)=$V_{DD}$, Y(N/2)'=0), and TCAM cell $600_{(N-1)}$ stores a 'don't care° value (i.e., X(N−1)=0, X(N−1)'=$V_{DD}$, Y(N−1)=0, Y(N−1)'=$V_{DD}$). Column 601 exhibits the same worst case read conditions as column 301.

Although the present invention has been described in connection with various embodiments, it is understood that variations of these embodiments would be obvious to one of ordinary skill in the art. For example, although the present invention has been described in accordance with a column of TCAM cells, it is understood that the teachings of the present disclosure can be extended to multiple columns (i.e., an array) of TCAM cells. Moreover, although the present invention has been described in connection with bit lines that are twisted one time within a column, it is understood that bit lines may be twisted multiple times within a column (while implementing the teachings of the present invention for each additional bit line twist) to offset cross-talk noise from neighboring columns in other embodiments. Thus, the present invention is limited only by the following claims.

I claim:

1. A memory system comprising:
   a plurality of ternary content addressable memory (TCAM) cells arranged in a column, each TCAM cell including at least one memory cell and match logic;
   wherein each memory cell of a first set of the TCAM cells in the column has a first layout, and each memory cell of a second set of the TCAM cells in the column has a second layout, the second layout being a mirror image about a vertical axis of the first layout, and wherein the match logic of each TCAM cell has the same layout as each other; and
   a bit line pair connected to each of the plurality of TCAM cells, wherein data is written to and read from the TCAM cells on the bit line pair.

2. The memory system of claim 1, further comprising a write decoder logic coupled to receive a write data value and a write address value, wherein the write decoder logic (i) inverts the write data value if a write operation accesses a TCAM cell in the first set of TCAM cells, and (ii) does not invert the write data value if a write operation accesses a TCAM cell in the second set of TCAM cells.

3. The memory system of claim 1, further comprising a read decoder logic coupled to receive a read data value provided on the bit line pair and a read address value, wherein the read decoder logic (i) inverts the read data value if a read operation accesses a TCAM cell in the first set of TCAM cells, and (ii) does not invert the read data value if a read operation accesses a TCAM cell in the second set of TCAM cells.

4. A method comprising:
   writing data to a column of ternary content addressable memory (TCAM) cells via a bit line pair, each TCAM cell including at least one memory cell and match logic, wherein each memory cell of a first set of TCAM cells in the column has a first layout, and each memory cell of a second set of TCAM cells in the column has a second layout, the second layout being a mirror image about a vertical axis of the first layout, and wherein the match logic of each TCAM cell has the same layout as each other;
   wherein the first set of TCAM cells are written with a first bit line polarity, and the second set of TCAM cells are written with a second bit line polarity, the second bit line polarity being opposite the first bit line polarity; and
   reading data from the column of TCAM cells via the bit line pair, wherein the first set of the TCAM cells are read with the first bit line polarity, and the second set of the TCAM cells are read with the second bit line polarity.

5. The method of claim 4, wherein writing data to a column of TCAM cells includes determining whether the write operation will be performed in the first set of TCAM cells or the second set of TCAM cells.

6. The method of claim 4, wherein reading data from the column of TCAM cells includes determining whether the read operation will be performed in the first set of TCAM cells or the second set of TCAM cells.

7. The memory system of claim 1, further comprising a search line pair connected to each of the plurality of TCAM cells, wherein search data is provided to the TCAM cells on the search line pair.

8. The memory system of claim 1, wherein each of the plurality of TCAM cells comprises a first memory circuit coupled to the bit line pair, and a second memory circuit coupled to the bit line pair.

9. The memory system of claim 8, wherein the first and second memory circuits are static random access memory (SRAM) cells, each having a pair of access transistors coupled to the bit line pair.

10. The memory system of claim 2, wherein the write decoder logic comprises an exclusive OR circuit.

11. The memory system of claim 3, wherein the read decoder logic comprises an exclusive OR circuit.

* * * * *